US010819279B1

(12) United States Patent
Monsalve et al.

(10) Patent No.: US 10,819,279 B1
(45) Date of Patent: Oct. 27, 2020

(54) LOW POWER CRYSTAL OSCILLATOR (71) Applicant: NXP USA, INC., Austin, TX (US)

(72) Inventors: Juan Camilo Monsalve, Campinas (BR); Ricardo Pureza Coimbra, Campinas (BR); James Robert Feddeler, Lake Village, IN (US); Stefano Pietri, Austin, TX (US)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 16/456,774

(22) Filed: Jun. 28, 2019

(51) Int. Cl.
    *H03B 5/36* (2006.01)
    *H03L 5/02* (2006.01)
    *H03H 11/04* (2006.01)

(52) U.S. Cl.
    CPC .............. *H03B 5/36* (2013.01); *H03B 5/364* (2013.01); *H03B 5/366* (2013.01); *H03H 11/04* (2013.01); *H03L 5/02* (2013.01)

(58) Field of Classification Search
    CPC ... H03B 5/30; H03B 5/32; H03B 5/36; H03B 5/364; H03B 5/366; H03B 5/368; H03B 2200/0082; H03H 11/04; H03L 5/00; H03L 5/02
    USPC .................................................. 331/158, 160
    See application file for complete search history.

(56) References Cited

U.S. PATENT DOCUMENTS

| 4,405,906 A | 9/1983 | Luscher et al. |
| 5,113,156 A | 5/1992 | Mahabadi et al. |
| 5,450,042 A | 9/1995 | Good et al. |
| 5,909,152 A * | 6/1999 | Li ........................... H03K 3/014 331/116 FE |
| 6,278,338 B1 * | 8/2001 | Jansson .................. H03B 5/364 331/109 |
| 6,861,917 B2 | 3/2005 | Stevenson et al. |
| 7,034,628 B1 * | 4/2006 | Lu ............................ H03B 5/06 331/158 |
| 7,123,113 B1 * | 10/2006 | Brennan ................... H03L 5/00 331/158 |
| 7,372,342 B2 | 5/2008 | Berens |
| 7,839,228 B2 * | 11/2010 | Greenberg ............... H03L 5/00 331/116 FE |
| 9,054,637 B1 * | 6/2015 | Mittal ..................... H03B 5/364 |
| 9,209,747 B1 | 12/2015 | Sinha et al. |
| 9,252,708 B1 * | 2/2016 | Sinitsky ................. H03B 5/362 |
| 9,407,201 B1 * | 8/2016 | Iguchi ...................... H03B 5/06 |
| 2006/0139104 A1 * | 6/2006 | Stevenson ................ H03B 5/06 331/16 |
| 2012/0326762 A1 * | 12/2012 | Sakai ....................... H03B 5/06 327/291 |
| 2014/0210565 A1 * | 7/2014 | Vilas Boas .............. H03B 5/06 331/158 |
| 2015/0061786 A1 * | 3/2015 | Mai ........................ H03B 5/364 331/116 FE |

(Continued)

*Primary Examiner* — Levi Gannon (57) ABSTRACT

A low power crystal oscillator is provided. The crystal oscillator includes a gain control stage, a filter stage, and an output stage. The gain control stage includes an input coupled at a first oscillator terminal configured and arranged for connection to a first terminal of a crystal. The filter stage includes an input coupled to an output of the gain control stage. The output stage includes a first transistor having a first current electrode coupled at a second oscillator terminal configured and arranged for connection to a second terminal of the crystal and a control electrode coupled to receive a voltage signal at the first oscillator terminal and a first bias voltage.

20 Claims, 5 Drawing Sheets

(56) References Cited

U.S. PATENT DOCUMENTS

2020/0036383 A1\* 1/2020 Connell .................. H03B 5/06

\* cited by examiner

LOW POWER CRYSTAL OSCILLATOR

BACKGROUND

Field

This disclosure relates generally to electronic circuits, and more specifically, to a low power crystal oscillator.

Related Art

Today, a broad range of modern electronic devices incorporate crystal oscillators. Many of these electronic devices transmit or receive information or have other synchronous circuitry which utilizes a clock signal derived from a crystal oscillator. In some applications, crystal oscillators may be customized for use with a specific supplier's physical crystal in order to minimize costs. Such customization may limit the number of suppliers available because of crystal-to-crystal variations. In battery powered applications, it is important for crystal oscillators to consume as little energy as possible in order to achieve a long battery life. It is thus desirable to provide a crystal oscillator that accommodates a wide range of crystal-to-crystal variations and long battery life.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Generally, there is provided, a low power crystal oscillator configured to operate at a predetermined range of frequencies. A configurable gain P-channel transistor serves as a current source for an N-channel transistor configured to act as a negative impedance element sufficient to sustain oscillation of the crystal oscillator. The configurable gain P-channel transistor can be selectively configured when mated with the N-channel transistor to accommodate a wide variety of crystals. A buffer circuit is coupled to the crystal oscillator to provide a clock signal based on the crystal oscillator.

Figure 1:
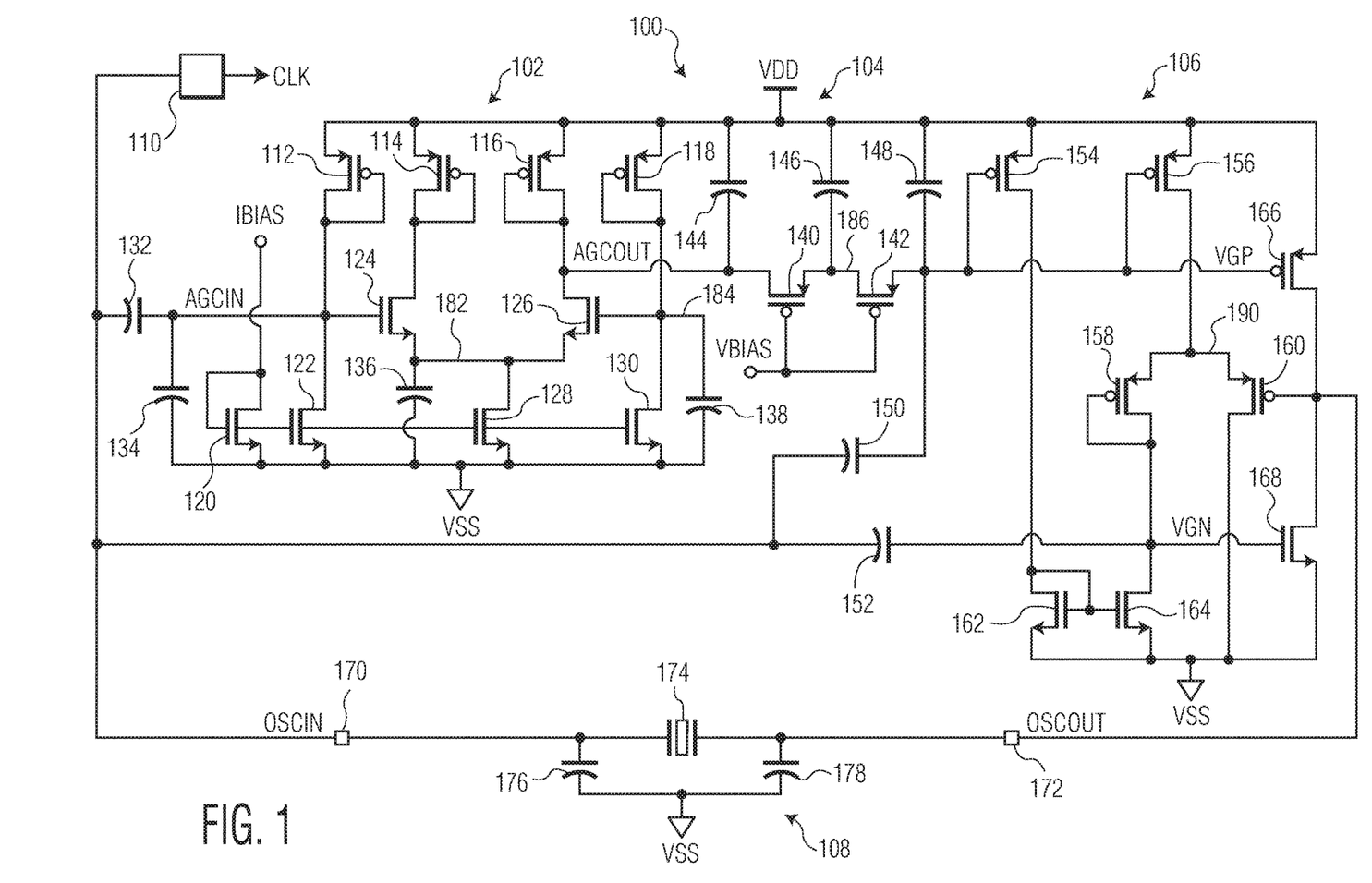
FIG. 1 illustrates, in simplified schematic diagram form, an example low power crystal oscillator in accordance with an embodiment.

FIG. 1 illustrates, in simplified schematic diagram form, an example low power crystal oscillator 100 in accordance with an embodiment. Oscillator 100 includes a gain control stage 102, a filter stage 104, an output stage 106, a crystal 108, and a buffer circuit 110. In this embodiment, gain control stage 102, filter stage 104, output stage 106, and buffer circuit 110 are formed on an integrated circuit (IC) while crystal 108 is formed as a component separate from the IC and connected at oscillator terminals 170-172 labeled OSCIN and OSCOUT respectively.

The gain control stage 102 is implemented as an automatic gain control circuit (AGC) and includes P-channel transistors 112-118, N-channel transistors 120-130, and capacitors 132-138 in this embodiment. An input of the gain control stage 102 labeled AGCIN is coupled to receive a sinusoidal signal at oscillator terminal OSCIN by way of a capacitor divider formed by capacitors 132 and 134. An output of the gain control stage 102 labeled AGCOUT is coupled to provide an amplitude-controlled signal to the filter stage 104.

A first terminal of capacitor 132 is coupled at the OSCIN terminal and a second terminal of capacitor 132 is coupled to a first terminal of capacitor 134 at the AGCIN input. A first current electrode and control electrode of transistor 112 are coupled to a control electrode of transistor 124 and a first current electrode of transistor 122 at the AGCIN input. A first current electrode and control electrode of transistor 114 are coupled to a first current electrode of transistor 124. A second current electrode of transistor 124 is coupled to a first current electrode of transistor 128, a first current electrode of transistor 126, and a first terminal of capacitor 136 at node 182. A first current electrode and control electrode of transistor 116 are coupled to a second current electrode of transistor 126 at the AGCOUT output. A first current electrode and control electrode of transistor 118 are coupled to a control electrode of transistor 126, a first current electrode of transistor 130, and a first terminal of capacitor 138. A first current electrode of transistor 120 and control electrodes of transistors 120, 122, 128, 130 are coupled at a terminal labeled BIAS. In this embodiment, transistor 120 is configured and arranged to provide a bias voltage to transistors 120, 122, 128, 130 based on the BIAS bias current. Second current electrodes of transistors 120, 122, 128, 130 and second terminals of capacitors 134-138 are coupled at voltage supply terminal labeled VSS (e.g., ground). Second current electrodes of transistors 112-118 are coupled at voltage supply terminal labeled VDD. In this embodiment, a normal operating voltage is supplied at the VDD supply terminal.

The filter stage 104 is implemented as a low-pass filter circuit and includes P-channel transistors 140-142 and capacitors 144-148 in this embodiment. An input of the filter stage 104 is coupled to receive the AGCOUT signal at the node labeled AGCOUT and in turn provide a filtered signal VGP at node labeled VGP. A first current electrode of transistor 140 is coupled to a first terminal of capacitor 144 at the AGCOUT node. A second current electrode of transistor 140 is coupled to a first current electrode of transistor 142 and a first terminal of capacitor 146 at node 186. A second current electrode of transistor 142 is coupled to a first terminal of capacitor 148 at node VGP. Second terminals of capacitors 144-148 are coupled at the VDD supply terminal. Control electrodes of transistors 140-142 are coupled at a terminal labeled VBIAS and are configured and arranged to receive a bias voltage VBIAS. In this embodiment, the VBIAS voltage value is set for triode region operation of transistors 140-142 allowing for large resistance values to be realized while using significantly less die area relative to common resistors.

The output stage 106 is implemented as a transconductance controlled circuit configured and arranged to sustain desired oscillation parameters (e.g., amplitude, frequency) of the oscillator 100 in this embodiment. The output stage 106 includes P-channel transistors 154-160, 166 and N-channel transistors 162-164, 168. A first input node labeled VGP of the output stage 106 is coupled to receive the VGP signal and a second input node labeled VGN of the output stage 106 is coupled to receive a sinusoidal signal at oscillator terminal OSCIN by way of capacitor 152. An output labeled OSCOUT of the output stage 106 is coupled at oscillator terminal 172.

Figure 2:
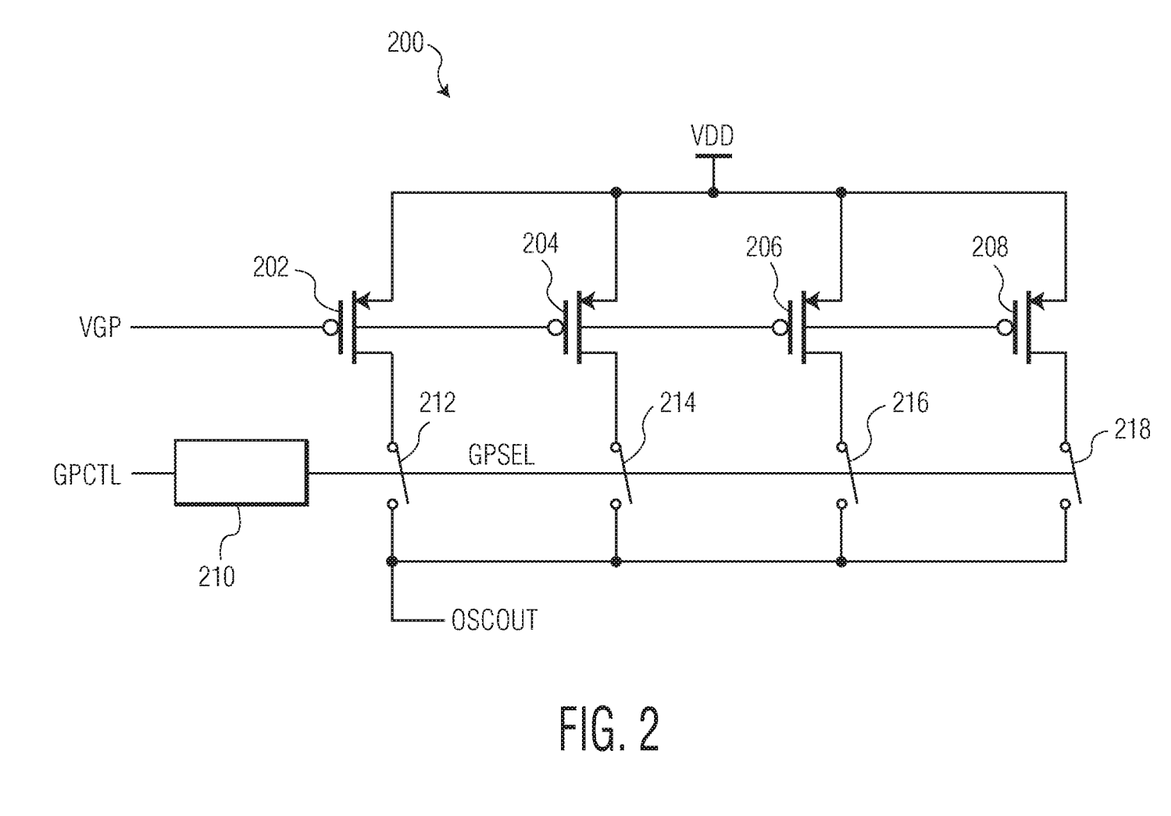
FIG. 2 illustrates, in simplified schematic diagram form, an example configurable gain circuit in accordance with an embodiment.

A control electrode of transistor 154 is coupled at node VGP and a first current electrode of transistor 154 is coupled to a first current electrode of transistor 162 and control electrodes of transistors 162-164. A control electrode of transistor 156 is coupled at node VGP and a first current electrode of transistor 156 is coupled to first current electrodes of transistors 158-160 at node 190. A second current electrode and control electrode of transistor 158 is coupled to a first current electrode of transistor 164 and control electrode of transistor 168 at node VGN. A control electrode of transistor 166 is coupled at node VGP and a first current electrode of transistor 166 is coupled to a first current electrode of transistor 168 and a control electrode of transistor 160 at the OSCOUT output node. Second current electrodes of transistors 160-164, 168 are coupled at voltage supply terminal labeled VSS (e.g., ground). Second current electrodes of transistors 154-156, 166 are coupled at voltage supply terminal labeled VDD. In this embodiment, transistor 166 serves as a configurable current source for controlling the transconductance of transistor 168. Transistor 168 is configured and arranged as a common source amplifier for compensating losses in the oscillator 100. An example implementation of the transistor 166 is shown in FIG. 2

In this embodiment, the OSCIN signal at the OSCIN input is coupled to the VGP input node by way of capacitor 150 and coupled to the VGN input node by way of capacitor 152. Capacitor 150 is configured and arranged to boost gain as well as reduce power consumption. First terminals of capacitors 150 and 152 are coupled at the OSCIN input node. A second terminal of capacitor 150 is coupled at node VGP and a second terminal of capacitor 152 is coupled at node VGN.

The crystal circuit 108 may be formed as an external packaged crystal in this embodiment, separate from a packaged IC including the gain control stage 102, the filter stage 104, the output stage 106, and the buffer circuit 110. The crystal circuit 108 is coupled to oscillator terminals 170-172 (e.g., leads of the packaged IC). In this embodiment, the crystal circuit 108 includes crystal 174 and capacitors 176-178. In other embodiments, the capacitors 176-178 may be integrated into the packaged IC. A first terminal of crystal 174 is coupled to a first terminal of capacitor 176 at oscillator terminal 170 (OSCIN) and a second terminal of crystal 174 is coupled to a first terminal of capacitor 178 at oscillator terminal 172 (OSCOUT). Second terminals of capacitors 176-178 are coupled at the VSS supply terminal. In this embodiment, the crystal 174 is chosen to include properties conducive for operation at 32.768 kilohertz (kHz). In other embodiment, the crystal 174 may be chosen to include properties conducive for operation at other frequencies in a desired frequency range.

The buffer circuit 110 is coupled to receive a sinusoidal signal at the OSCIN input and in turn, generate a square wave output clock signal labeled CLK. In this embodiment, the buffer circuit 110 is characterized as a low power Schmitt trigger buffer circuit. An example implementation of the Schmitt trigger is shown in FIG. 3.

FIG. 2 illustrates, in simplified schematic diagram form, an example configurable gain circuit 200 in accordance with an embodiment. In this embodiment, the configurable gain circuit 200 is representative of an example implementation of P-channel transistor 166 of FIG. 1. The configurable gain circuit 200 includes a parallel arrangement of a plurality of P-channel transistors 202-208, a corresponding plurality of switches 212-218, and a control circuit 210. First current electrodes of transistors 202 are coupled to first terminals of switches 212-218, respectively. Second current electrodes of transistors 202-208 are coupled to the VDD supply terminal and second terminals of switches 212-218 are coupled to the OSCOUT node. Control circuit 210 is coupled to receive a control signal labeled GPCTL and in turn, provide a selection signal labeled GPSEL. For example, the GPCTL signal may be a multi-bit signal decoded by the control circuit 210 to provide a multi-bit GPSEL signal to select a desired number of P-channel transistors to be coupled to the OSCOUT node. Accordingly, a desired gain can be configured by selecting an appropriate number of transistors 202-208 to be coupled in parallel at the OSCOUT node. The configurable gain circuit 200 implementation of P-channel transistor 166 serves as a configurable current source for controlling transconductance of N-channel transistor 168 depicted in FIG. 1. In this embodiment, the configurable gain circuit 200 includes four transistors (202-208) and accompanying switches (212-218) arranged in a parallel configuration. In other embodiments, a fewer or greater number of transistors with switches may be arranged in the parallel configuration as desired to form the configurable gain circuit 200.

Figure 3:
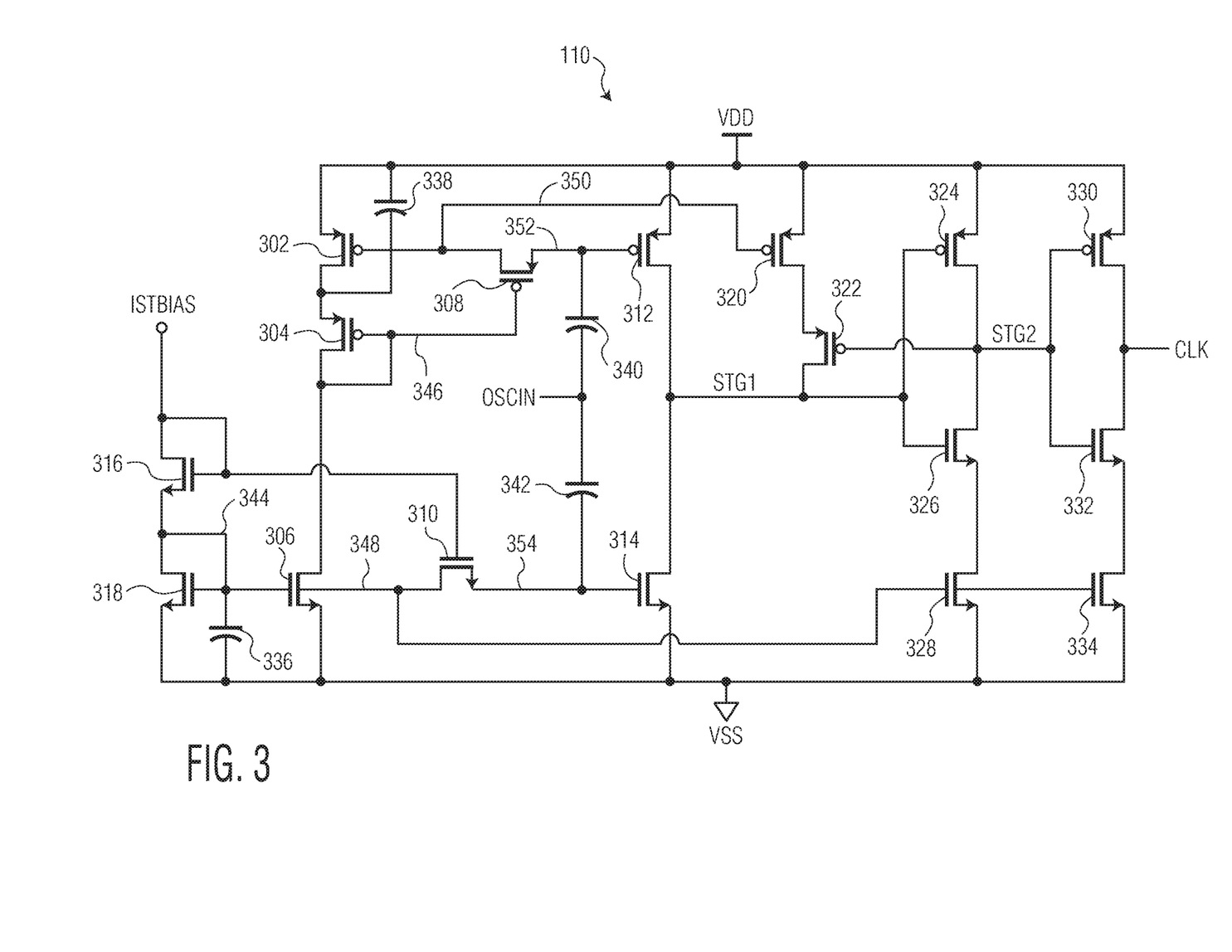
FIG. 3 illustrates, in simplified schematic diagram form, an example buffer circuit in accordance with an embodiment.

FIG. 3 illustrates, in simplified schematic diagram form, an example buffer circuit 110 implementation in accordance with an embodiment. In this embodiment, the buffer circuit 110 is configured and arranged as a low power Schmitt trigger buffer circuit. The buffer circuit 110 is coupled to receive a sinusoidal signal at the OSCIN input and coupled to provide a square wave output clock signal labeled CLK.

The buffer circuit 110 is implemented as a low power Schmitt trigger buffer circuit and includes P-channel transistors 302-304, 308, 312, 320-324, 330, N-channel transistors 306, 310, 314-318, 326-328, 332-334, and capacitors 336-342 in this embodiment. An input of the buffer circuit 110 is coupled to receive the sinusoidal signal at oscillator terminal 170 (OSCIN) by way of capacitors 340 and 342. An output of the buffer circuit 110 labeled CLK is coupled to provide the square wave output clock signal CLK. First terminals of capacitors 340-342 are coupled at the OSCIN node. A second terminal of capacitor 340 is coupled to a first current electrode of transistor 308 and a control electrode of transistor 312 at node 352. A second terminal of capacitor 342 is coupled to a first current electrode of transistor 310 and a control electrode of transistor 314 at node 354. A second current electrode of transistor 308 is coupled to a control electrode of transistor 302 and a control electrode of transistor 320 at node 350. A control current electrode of transistor 308 is coupled to a control electrode of transistor 304 and first current electrodes of transistors 304 and 306 at node 346. A second current electrode of transistor 304 is coupled to a first current electrode of transistor 302 and a first terminal of capacitor 338.

Transistors 316 and 318 are configured in a stacked diode arrangement to generate a bias voltage at node 348 based on a bias current ISTBIAS coupled at terminal node labeled ISTBIAS. A first current electrode and a control electrode of transistor 316 is coupled to a control electrode of transistor 310 at the ISTBIAS node. A second current electrode of transistor 316 is coupled to a first current electrode of transistor 318, a second current electrode of transistor 310, control electrodes of transistors 306, 314, 318, 328, 334 and a first terminal of capacitor 336 at node 348. First current electrodes of transistors 312 and 314 are coupled to a first current electrode of transistor 322 and control electrodes of transistors 324-326 at node labeled STG1. A control electrode of transistor 322 is coupled to first current electrodes of transistors 324-326 and control electrodes of transistors 330-332 at node labeled STG2. A second current electrode of transistor 322 is coupled to a first current electrode of transistor 320. In this embodiment, transistor 320 serves to provide hysteresis in the buffer circuit 110. First current electrodes of transistors 330-332 are coupled at output CLK. A second current electrode of transistor 326 is coupled to a first current electrode of transistor 328. A second current electrode of transistor 332 is coupled to a first current electrode of transistor 334. Second current electrodes of transistors 302, 312, 320, 324, 300 and a second terminal of capacitor 338 are coupled at the VDD supply terminal. Second current electrodes of transistors 306, 314, 318, 328, 334 and a second terminal of capacitor 336 are coupled at the VSS supply terminal.

Figure 4:
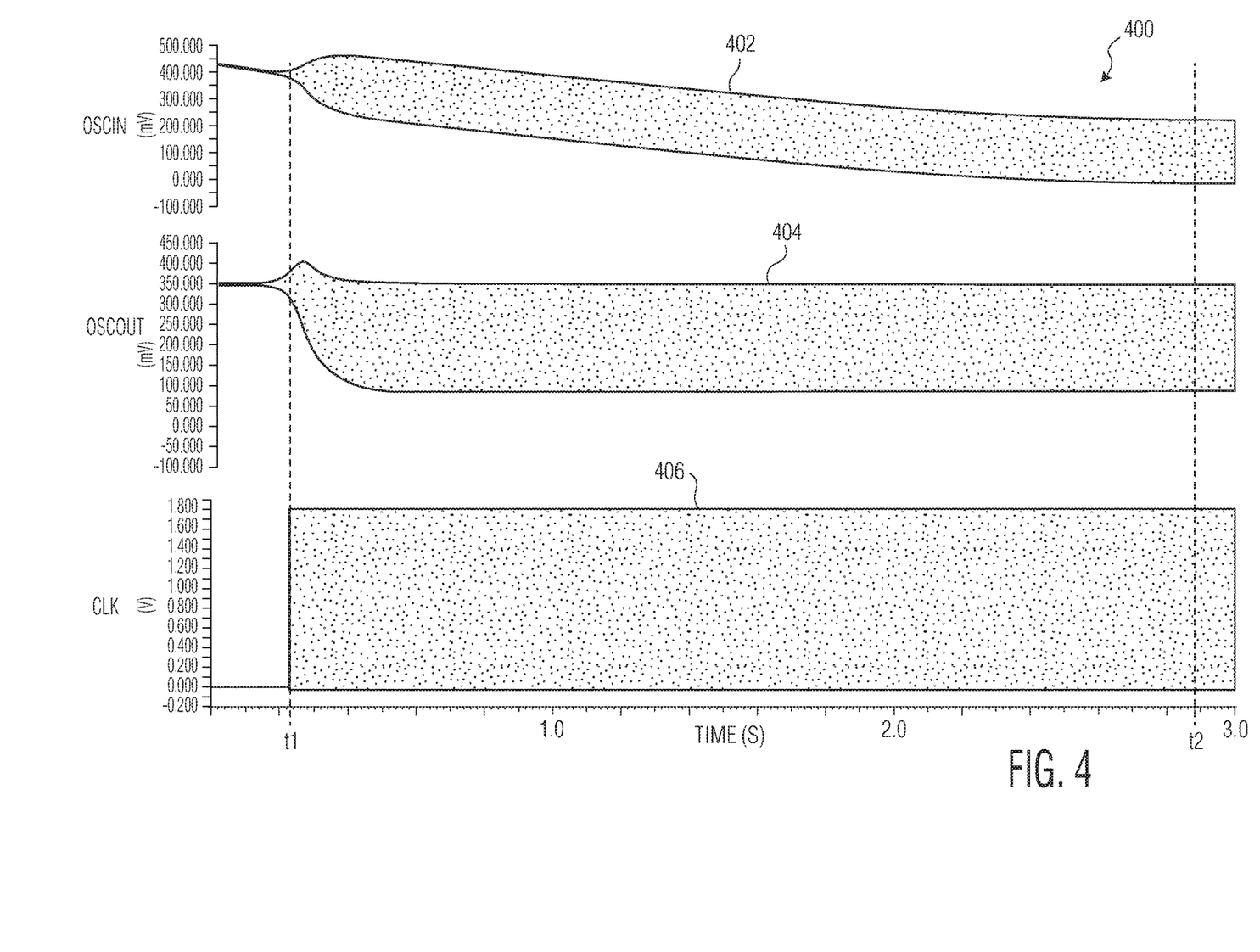
FIG. 4 illustrates, in plot diagram form, an example simulation result of the low power crystal oscillator start-up in accordance with an embodiment.

FIG. 4 illustrates, in plot diagram form, an example start-up simulation result of the oscillator 100 depicted in FIG. 1 in accordance with an embodiment. The plot diagram 400 includes OSCIN voltage signal waveform 402 corresponding to a voltage signal at the OSCIN node, OSCOUT voltage signal waveform 404 corresponding to a voltage signal at the OSCOUT node, and CLK voltage signal waveform 406 corresponding to a clock signal at the CLK output. The OSCIN and OSCOUT waveforms are shown with voltage values in millivolts (mV) on the Y-axis and the CLK waveform is shown with voltage values in volts (V) on the Y-axis. The OSCIN, OSCOUT, and CLK waveforms are shown with time values in seconds (S) on the X-axis. By way of example, start-up operation of the oscillator 100 is depicted in the following.

At time t1, the oscillator 100 is enabled and in a start-up phase of operation. The OSCIN and OSCOUT signals begin oscillating, and in turn, the CLK signal begins toggling based on the OSCIN signal. In this embodiment, the CLK signal begins toggling at about 230 milliseconds (ms) after the oscillator 100 is enabled. At time t2, the oscillator 100 reaches a steady-state behavior. After approximately 2.7 seconds from time t1, the OSCIN signal settles to a normal steady-state operating voltage range. It should be noted that because the OSCIN, OSCOUT, and CLK signals are transitioning at a much faster rate than the timescale of the X-axis, their waveforms are illustrated as stipple fill regions. For example, the OSCIN, OSCOUT, and CLK signals are transitioning at about 33 kHz rate as configured in this embodiment.

Figure 5:
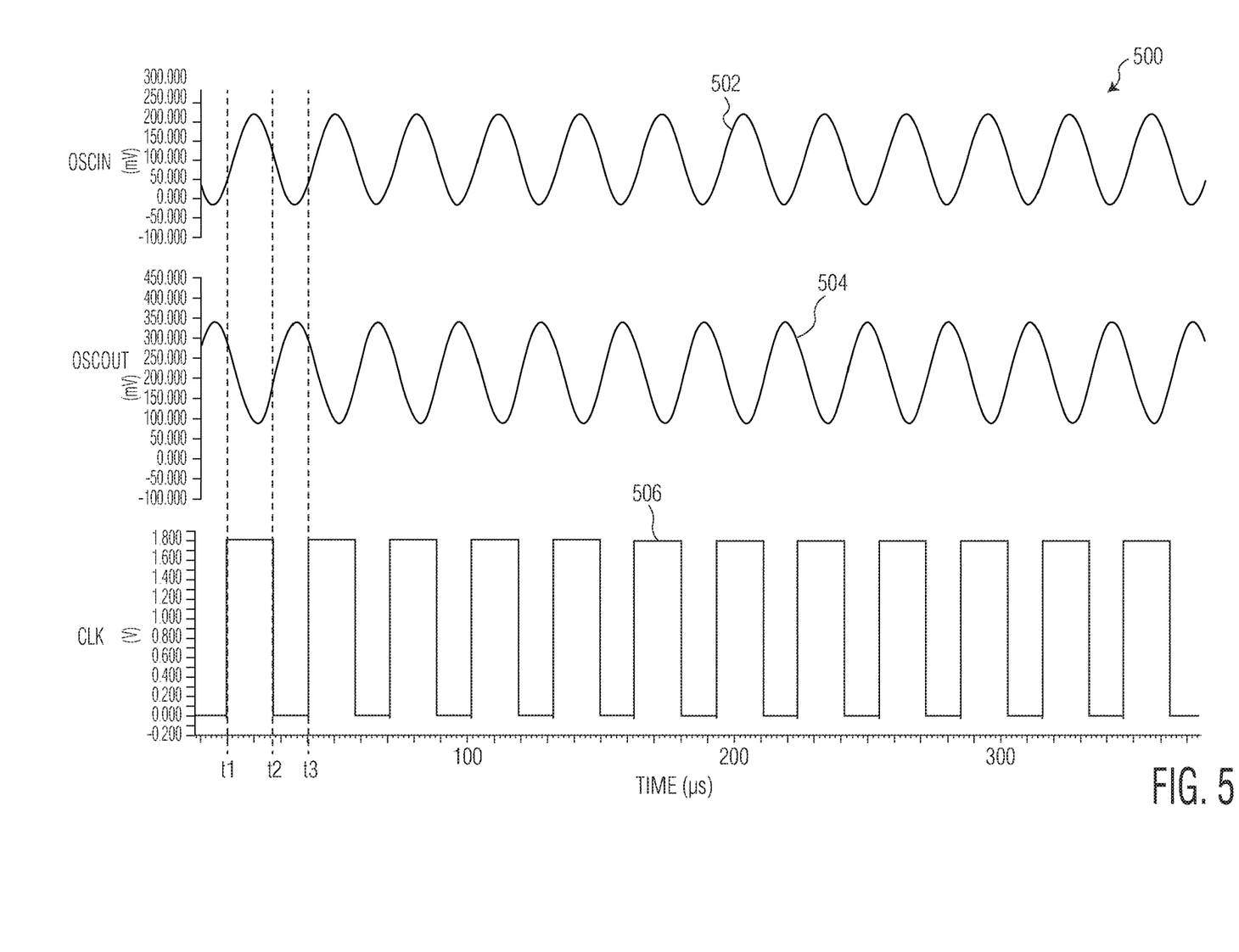
FIG. 5 illustrates, in plot diagram form, an example simulation result of the low power crystal oscillator steady-state operation in accordance with an embodiment.

FIG. 5 illustrates, in plot diagram form, an example steady-state simulation result of the oscillator 100 depicted in FIG. 1 in accordance with an embodiment. The plot diagram 500 includes OSCIN voltage signal waveform 502 corresponding to a voltage signal at the OSCIN node, OSCOUT voltage signal waveform 504 corresponding to a voltage signal at the OSCOUT node, and CLK voltage signal waveform 506 corresponding to a clock signal at the CLK output. The OSCIN and OSCOUT waveforms are shown with voltage values in millivolts (mV) on the Y-axis and the CLK waveform is shown with voltage values in volts (V) on the Y-axis. The OSCIN, OSCOUT, and CLK waveforms are shown with time values in milliseconds (µs) on the X-axis. By way of example, steady-state normal operation of the oscillator 100 is depicted in the following.

At time t1, the oscillator 100 is in a steady-state, normal phase of operation. The OSCIN and OSCOUT signals are oscillating at a predetermined frequency (e.g., 32.768 kHz) based on a selected crystal (e.g., crystal 174) and associated circuit parameters (e.g., sizes of transistors 166 and 168). The CLK signal is toggling at the predetermined frequency based on the OSCIN signal. In this embodiment, the OSCIN signal is in the form of a substantially sinusoidal signal swinging between 0 Volts and 200 mV and the OSCOUT signal is in the form of a substantially sinusoidal signal swinging between 100 mV and 350 mV. The OSCOUT signal is approximately 180 degrees out of phase with the OSCIN signal. The CLK signal is in the form of square wave signal (e.g., clock signal) and substantially follows the OSCIN waveform. For example, at time t1, the OSCIN is transitioning to a high level and in turn the CLK signal transitions to a logic high level.

At time t2, the OSCIN signal is transitioning to a low level and in turn, the CLK signal transitions to a logic low level completing a logic high portion of the CLK cycle. Because the OSCOUT signal is approximately 180 degrees out of phase with the OSCIN signal, the OSCOUT signal is transitioning to a high level at time t2.

At time t3, the OSCIN signal is transitioning again to a high level and in turn, the CLK signal transitions to a logic high level completing a period or cycle of the CLK signal. In this embodiment, the CLK period is measured as t3 minus t1 (e.g., 40 µs–10 µs=30 µs) which corresponds to a frequency of approximately 33 kHz. Because the OSCOUT signal is approximately 180 degrees out of phase with the OSCIN signal, the OSCOUT signal is transitioning to a low level at time t3.

Generally, there is provided, a crystal oscillator circuit including a gain control stage having an input coupled at a first oscillator terminal, the first oscillator terminal configured and arranged for connection to a first terminal of a crystal; a filter stage having an input and an output, the filter stage input coupled to an output of the gain control stage; and an output stage coupled between a first voltage supply terminal and a second voltage supply terminal, the output stage including a first transistor having a first current electrode coupled at a second oscillator terminal configured and arranged for connection to a second terminal of the crystal, a second current electrode coupled the second voltage supply terminal, and a control electrode coupled to receive a voltage signal at the first oscillator terminal and a first bias voltage. The first transistor may be configured and arranged as a common source amplifier. The output stage may further include a second transistor, the second transistor having a first current electrode coupled at the second oscillator terminal and a control electrode coupled at the output of the filter stage. The second transistor may be implemented as a configurable parallel arrangement of a plurality of P-channel MOS field effect transistors. The output stage may further include a second transistor having a control electrode coupled at the output of the filter stage, a third transistor having a first current electrode coupled at the control electrode of the first transistor, and a fourth transistor having a first current electrode coupled to a first current electrode of the second transistor and control electrodes of the third and fourth transistors. The third transistor and the fourth transistor may be configured and arranged to form a current mirror. The filter stage may further include a capacitor having a first terminal coupled to the first voltage supply terminal and a second terminal coupled at the output of the gain control stage and a second transistor coupled between the gain control stage and the output stage, the second transistor having a first current electrode coupled at the output of the gain control stage and a control electrode coupled to receive a second bias voltage. The circuit may further include a buffer circuit having an input coupled at the first oscillator terminal, the buffer circuit characterized as a Schmitt-trigger circuit configured and arranged to generate a clock signal based on an oscillator signal at the first oscillator terminal. The circuit may further include a capacitor having a first terminal coupled at the first oscillator terminal and a second terminal coupled at the control electrode of the first transistor.

In another embodiment, there is provided, a crystal oscillator circuit including a gain control stage having an input and an output, the gain control stage input coupled at a first oscillator terminal; a filter stage having an input and an output, the filter stage input coupled to the output of the gain control stage; and an output stage having an input coupled at the output of the filter stage, the output stage comprising: a bias circuit coupled between a first voltage supply terminal and a second voltage supply terminal, the bias circuit configured and arranged to generate a first bias voltage; and a first transistor having a first current electrode coupled at a second oscillator terminal, a second current electrode coupled at the second voltage supply terminal, and a control electrode coupled to receive the first bias voltage. The output stage may further include a second transistor, the second transistor having a first current electrode coupled at the second oscillator terminal, a second current electrode coupled at the first voltage supply terminal, and a control electrode coupled at the output of the filter stage. The second transistor may serve as a configurable current source for controlling the transconductance of the first transistor. The bias circuit may further include a second transistor having a control electrode coupled at the output of the filter stage, a third transistor having a first current electrode coupled at the control electrode of the first transistor and a second current electrode coupled at the second voltage supply terminal, and a fourth transistor having a first current electrode coupled to a first current electrode of the second transistor, a second current electrode coupled at the second voltage supply terminal, and control electrodes of the third and fourth transistors. The filter stage may further include a capacitor having a first terminal coupled to the first voltage supply terminal and a second terminal coupled at the output of the gain control stage and a second transistor coupled between the gain control stage and the output stage, the second transistor having a first current electrode coupled at the output of the gain control stage and a control electrode coupled to receive a second bias voltage. The circuit may further include a capacitor divider configured and arranged to couple a voltage signal at the first oscillator terminal to the gain control stage input. The circuit may further include a buffer circuit having an input coupled at the first oscillator terminal, the buffer circuit may be configured and arranged to convert a sinusoidal voltage signal at the first oscillator terminal to a substantially square waveform clock signal at an output.

In yet another embodiment, there is provided, a crystal oscillator circuit including a gain control stage having an input and an output, the gain control stage input coupled at a first oscillator terminal; a filter stage having an input and an output, the filter stage input coupled to the output of the gain control stage; and an output stage having an input coupled at the output of the filter stage, the output stage including a first transistor having a first current electrode coupled at a second oscillator terminal, a second current electrode coupled at a first voltage supply terminal, and a control electrode coupled to the output of the filter stage; and a second transistor having a first current electrode coupled at the second oscillator terminal, a second current electrode coupled at a second voltage supply terminal, and a control electrode coupled at the first oscillator terminal. The first transistor and the second transistor may be configured and arranged such that the first transistor serves as a configurable current source for controlling the transconductance of the second transistor. The circuit may further include a capacitor divider configured and arranged to couple a voltage signal at the first oscillator terminal to the gain control stage input. The output stage may further include a bias circuit having an input coupled to the second oscillator terminal, the bias circuit may be configured and arranged to generate a DC bias voltage at the control electrode of the second transistor.

By now it should be appreciated that there has been provided, a low power crystal oscillator configured to operate at a predetermined range of frequencies. A configurable gain P-channel transistor serves as a current source for an N-channel transistor configured to act as a negative impedance element sufficient to sustain oscillation of the crystal oscillator. The configurable gain P-channel transistor can be selectively configured when mated with the N-channel transistor to accommodate a wide variety of crystals. A buffer circuit is coupled to the crystal oscillator to provide a clock signal based on the crystal oscillator.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:
1. A crystal oscillator circuit comprising:
 a gain control stage having an input coupled at a first oscillator terminal, the first oscillator terminal configured and arranged for connection to a first terminal of a crystal;

an output stage coupled between a first voltage supply terminal and a second voltage supply terminal, the output stage comprising:
a first transistor having a first current electrode coupled at a second oscillator terminal configured and arranged for connection to a second terminal of the crystal, a second current electrode coupled the second voltage supply terminal, and a control electrode coupled to receive a voltage signal at the first oscillator terminal and a first bias voltage; and
a filter stage having an input and an output, the filter stage input coupled to an output of the gain control stage, the filter stage comprising:
a first capacitor having a first terminal coupled to the first voltage supply terminal and a second terminal coupled at the output of the gain control stage; and
a second transistor coupled between the gain control stage and the output stage, the second transistor having a first current electrode coupled at the output of the gain control stage and a control electrode coupled to receive a second bias voltage.

2. The circuit of claim 1, wherein the first transistor is configured and arranged as a common source amplifier.

3. The circuit of claim 1, wherein the output stage further comprises a third transistor, the third transistor having a first current electrode coupled at the second oscillator terminal and a control electrode coupled at the output of the filter stage.

4. The circuit of claim 3, wherein the third transistor is implemented as a configurable parallel arrangement of a plurality of P-channel MOS field effect transistors.

5. The circuit of claim 1, wherein the output stage further comprises:
a third transistor having a control electrode coupled at the output of the filter stage;
a fourth transistor having a first current electrode coupled at the control electrode of the first transistor; and
a fifth transistor having a first current electrode coupled to a first current electrode of the third transistor and control electrodes of the fourth and fifth transistors.

6. The circuit of claim 5, wherein the fourth transistor and the fourth fifth transistor are configured and arranged to form a current mirror.

7. The circuit of claim 1, further comprising a buffer circuit having an input coupled at the first oscillator terminal, the buffer circuit characterized as a Schmitt-trigger circuit configured and arranged to generate a clock signal based on an oscillator signal at the first oscillator terminal.

8. The circuit of claim 1, further comprising a second capacitor having a first terminal coupled at the first oscillator terminal and a second terminal coupled at the control electrode of the first transistor.

9. A crystal oscillator circuit comprising:
a gain control stage having an input and an output, the gain control stage input coupled at a first oscillator terminal;
an output stage having an input coupled at the output of the filter stage, the output stage comprising:
a bias circuit coupled between a first voltage supply terminal and a second voltage supply terminal, the bias circuit configured and arranged to generate a first bias voltage;
a first transistor having a first current electrode coupled at a second oscillator terminal, a second current electrode coupled at the second voltage supply terminal, and a control electrode coupled to receive the first bias voltage; and a filter stage having an input and an output, the filter stage input coupled to the output of the gain control stage, the filter stage comprising:
a capacitor having a first terminal coupled to the first voltage supply terminal and a second terminal coupled at the output of the gain control stage; and
a second transistor coupled between the gain control stage and the output stage, the second transistor having a first current electrode coupled at the output of the gain control stage and a control electrode coupled to receive a second bias voltage.

10. The circuit of claim 9, wherein the output stage further comprises a third transistor, the third transistor having a first current electrode coupled at the second oscillator terminal, a second current electrode coupled at the first voltage supply terminal, and a control electrode coupled at the output of the filter stage.

11. The circuit of claim 10, wherein the third transistor serves as a configurable current source for controlling the transconductance of the first transistor.

12. The circuit of claim 9, wherein the bias circuit further comprises:
a third transistor having a control electrode coupled at the output of the filter stage;
a fourth transistor having a first current electrode coupled at the control electrode of the first transistor and a second current electrode coupled at the second voltage supply terminal; and
a fifth transistor having a first current electrode coupled to a first current electrode of the third transistor and control electrodes of the fourth and fifth transistors, a second current electrode of the fifth transistor coupled at the second voltage supply terminal.

13. The circuit of claim 9, further comprising a capacitor divider configured and arranged to couple a voltage signal at the first oscillator terminal to the gain control stage input.

14. The circuit of claim 9, further comprising a buffer circuit having an input coupled at the first oscillator terminal, the buffer circuit configured and arranged to convert a sinusoidal voltage signal at the first oscillator terminal to a substantially square waveform clock signal at an output.

15. A crystal oscillator circuit comprising:
a gain control stage having an input and an output, the gain control stage input coupled at a first oscillator terminal;
a capacitor divider configured and arranged to couple a voltage signal at the first oscillator terminal to the gain control stage input;
a filter stage having an input and an output, the filter stage input coupled to the output of the gain control stage; and
an output stage having an input coupled at the output of the filter stage, the output stage comprising:
a first transistor having a first current electrode coupled at a second oscillator terminal, a second current electrode coupled at a first voltage supply terminal, and a control electrode coupled to the output of the filter stage; and
a second transistor having a first current electrode coupled at the second oscillator terminal, a second current electrode coupled at a second voltage supply terminal, and a control electrode coupled at the first oscillator terminal.

16. The circuit of claim 15, wherein the first transistor and the second transistor are configured and arranged such that the first transistor serves as a configurable current source for controlling the transconductance of the second transistor.

17. The circuit of claim 15, wherein the output stage further comprises a bias circuit having an input coupled to the second oscillator terminal, the bias circuit configured and arranged to generate a DC bias voltage at the control electrode of the second transistor.

18. The circuit of claim 15, further comprising a buffer circuit having an input coupled at the first oscillator terminal, the buffer circuit characterized as a Schmitt-trigger circuit configured and arranged to generate a clock signal based on an oscillator signal at the first oscillator terminal.

19. The circuit of claim 15, further comprising a capacitor having a first terminal coupled at the first oscillator terminal and a second terminal coupled at the control electrode of the second transistor.

20. The circuit of claim 15, wherein the filter stage further comprises a third transistor coupled between the gain control stage and the output stage, the second transistor having a first current electrode coupled at the output of the gain control stage and a control electrode coupled to receive a bias voltage.

* * * * *